(12) United States Patent
Xu

(10) Patent No.: US 11,641,058 B2
(45) Date of Patent: May 2, 2023

(54) ARRAY SUBSTRATE, DISPLAY PANEL, DISPLAY DEVICE, AND WEARABLE DEVICE

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventor: Zhenguo Xu, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 384 days.

(21) Appl. No.: 16/911,044

(22) Filed: Jun. 24, 2020

(65) Prior Publication Data
US 2021/0194130 A1 Jun. 24, 2021

(30) Foreign Application Priority Data
Dec. 20, 2019 (CN) .......................... 201911330526.5

(51) Int. Cl.
*H01Q 7/00* (2006.01)
*H01L 27/12* (2006.01)

(52) U.S. Cl.
CPC ........... *H01Q 7/00* (2013.01); *H01L 27/1255* (2013.01)

(58) Field of Classification Search
CPC .. H01Q 7/00; H01Q 1/2208; G06K 19/07773; H01F 38/14
See application file for complete search history.

(56) References Cited

U.S. PATENT DOCUMENTS

| 9,674,646 | B2* | 6/2017 | Jang ........................ H04W 4/80 |
| 10,564,487 | B2 | 2/2020 | Suzuki et al. |
| 10,847,311 | B2* | 11/2020 | Cho ......................... H01Q 7/00 |
| 10,936,931 | B2* | 3/2021 | Orihara ................ G06K 19/077 |
| 11,004,381 | B2 | 5/2021 | Ren et al. |

(Continued)

FOREIGN PATENT DOCUMENTS

| CN | 107731855 A | 2/2018 |
| CN | 208752362 U | 4/2019 |

(Continued)

OTHER PUBLICATIONS

First Chinese Office Action dated Nov. 12, 2021, received for corresponding Chinese Application No. 201911330526.5, pp. 15.

*Primary Examiner* — Jason Crawford
(74) *Attorney, Agent, or Firm* — Kinney & Lange, P.A.

(57) ABSTRACT

An array substrate, a display panel, a display device and a wearable device are provided. The array substrate includes a near field communication antenna which is arranged in conductive layers of the array substrate, and the near field communication antenna includes: a main coil and a secondary coil, the main coil and the secondary coil are located in different conductive layers of the array substrate, and one terminal of the main coil is electrically connected to one terminal of the secondary coil through a first via hole of the array substrate, and the other terminal of the main coil is electrically connected to the other terminal of the secondary coil through another first via hole of the array substrate.

8 Claims, 3 Drawing Sheets

(56) References Cited

U.S. PATENT DOCUMENTS

| | | | | |
|---|---|---|---|---|
| 2010/0182207 | A1* | 7/2010 | Miyata | H01Q 1/364 343/702 |
| 2011/0105072 | A1* | 5/2011 | Bhagat | H01L 23/5227 455/323 |
| 2011/0273382 | A1* | 11/2011 | Yoo | G06F 3/041 345/173 |
| 2013/0267170 | A1* | 10/2013 | Chong | H04M 1/026 455/41.1 |
| 2014/0145906 | A1* | 5/2014 | Kato | H01Q 7/00 343/867 |
| 2014/0168019 | A1* | 6/2014 | Hirobe | H01Q 1/2208 343/788 |
| 2014/0176819 | A1* | 6/2014 | Yilmaz | G06F 1/1698 349/12 |
| 2014/0355171 | A1 | 12/2014 | Gupta et al. | |
| 2015/0077296 | A1* | 3/2015 | An | H01Q 7/00 320/108 |
| 2015/0381239 | A1* | 12/2015 | Shostak | H01Q 1/243 343/720 |
| 2016/0261026 | A1* | 9/2016 | Han | H04B 5/0031 |
| 2017/0004921 | A1* | 1/2017 | Kim | H01F 27/22 |
| 2017/0040107 | A1* | 2/2017 | Peralta | H02J 50/80 |
| 2017/0040690 | A1* | 2/2017 | Peralta | H01F 27/2871 |
| 2017/0054213 | A1* | 2/2017 | Singh | H04B 5/0037 |
| 2017/0262120 | A1* | 9/2017 | Liu | G06F 3/0446 |
| 2018/0061869 | A1* | 3/2018 | Suzuki | G02F 1/134309 |
| 2018/0287243 | A1* | 10/2018 | Ko | H01Q 5/30 |
| 2019/0261521 | A1* | 8/2019 | Suzuki | H05K 1/0296 |
| 2019/0348209 | A1 | 11/2019 | Wen et al. | |
| 2020/0365626 | A1* | 11/2020 | Lin | G02F 1/13338 |
| 2021/0105045 | A1* | 4/2021 | Chen | H04B 5/0031 |
| 2021/0151474 | A1 | 5/2021 | Cao et al. | |
| 2021/0194130 | A1* | 6/2021 | Xu | H04B 5/0087 |

FOREIGN PATENT DOCUMENTS

| | | |
|---|---|---|
| CN | 109786396 A | 5/2019 |
| CN | 110474149 A | 11/2019 |

\* cited by examiner

ARRAY SUBSTRATE, DISPLAY PANEL, DISPLAY DEVICE, AND WEARABLE DEVICE

CROSS-REFERENCE TO RELATED APPLICATION

The present disclosure claims the benefit of Chinese Patent Application No. 201911330526.5 filed on Dec. 20, 2019 in the National Intellectual Property Administration of China, the whole disclosure of which is incorporated herein by reference.

TECHNICAL FIELD

The present disclosure relates to the field of display technology, and in particular, to an array substrate, a display panel, a display device and a wearable device.

BACKGROUND

At present, the near field communication (NFC) function has been widely used in mobile phones and smart wearable products. NFC antennas are usually laid independently and limited by the installable space of the device. A NFC antenna is usually arranged on the side of the device away from the display screen. For example, the NFC antenna of the mobile phone is generally designed in the back cover. When implementing communication functions such as payment, it is only necessary to take the back cover of the mobile phone close to a corresponding NFC communication terminal, such as a payment terminal. At this time, the NFC communication distance is short, and communication quality is guaranteed. However, there are differences in the usage habits between smart wearable products and mobile phones. Smart wearable products are worn on the body, for example, on the wrist, and the user will not choose to use the communication functions after taking the products off. Since the NFC antenna is placed inside the smart wearable product and away from the display screen, in this case, the NFC communication distance is long, the signal quality cannot be guaranteed, and the communication failure rate is high.

SUMMARY

According to an aspect of the present disclosure, there is provided an array substrate, wherein a near field communication antenna is arranged in conductive layers of the array substrate, and the near field communication antenna comprises: a main coil and a secondary coil, the main coil and the secondary coil are located in different conductive layers of the array substrate, and one terminal of the main coil is electrically connected to one terminal of the secondary coil through a first via hole of the array substrate, and the other terminal of the main coil is electrically connected to the other terminal of the secondary coil through another first via hole of the array substrate.

In some embodiments, the main coil and the secondary coil of the near field communication antenna are disposed coaxially.

In some embodiments, a line width of the main coil is smaller than that of the secondary coil, and a number of turns of the main coil is greater than that of the secondary coil.

In some embodiments, the number of turns of the main coil is twice that of the secondary coil; and/or the main coil has a line width of 0.6 mm and a line spacing of 0.2 mm; the secondary coil has a line width of 0.14 mm and a line spacing of 0.2 mm.

In some embodiments, the main coil comprises: a first main coil and a second main coil, the first main coil and the second main coil are located in a same conductive layer of the array substrate, and the first main coil and the second main coil are insulated from each other, one terminal of the first main coil is electrically connected to one terminal of the second main coil, and the other terminal of the first main coil is electrically connected to the other terminal of the second main coil; or the first main coil and the second main coil are located in different conductive layers of the array substrate, and one terminal of the first main coil is electrically connected to one terminal of the second main coil through a second via hole of the array substrate, and the other terminal of the first main coil is electrically connected to the other terminal of the second main coil through another second via hole of the array substrate.

In some embodiments, the first main coil and the second main coil are arranged coaxially; and/or if the first main coil and the second main coil are located in the same conductive layer of the array substrate, windings of the first main coil and windings of the second main coil are arranged alternately, two adjacent windings of the first main coil are electrically connected by a jumper, and two adjacent windings of the second main coil are also electrically connected by the jumper.

In some embodiments, the array substrate has a plurality of fourth via holes, the fourth via holes form the jumper between the two adjacent windings of the first main coil, or the fourth via holes form the jumper between the two adjacent windings of the second main coil.

In some embodiments, the secondary coil comprises: a first secondary coil and a second secondary coil;

the first secondary coil and the second secondary coil are located in a same conductive layer of the array substrate, and the first secondary coil and the second secondary coil are insulated from each other, one terminal of the first secondary coil is electrically connected to one terminal of the second secondary coil, and the other terminal of the first secondary coil is electrically connected to the other terminal of the second secondary coil; or the first secondary coil and the second secondary coil are located in different conductive layers of the array substrate, and one terminal of the first secondary coil is electrically connected to one terminal of the second secondary coil through a third via hole of the array substrate, and the other terminal of the first secondary coil is electrically connected to the other terminal of the second secondary coil through another third via hole of the array substrate.

In some embodiments, the first secondary coil and the second secondary coil are arranged coaxially; and/or if the first secondary coil and the second secondary coil are located in the same conductive layer of the array substrate, windings of the first secondary coil and windings of the second secondary coil are arranged alternately; two adjacent windings of the first secondary coil are electrically connected by a jumper, and two adjacent windings of the second secondary coil are also electrically connected by the jumper.

In some embodiments, the array substrate has a plurality of fifth via holes, the fifth via holes form the jumper between the two adjacent windings of the first secondary coil, or the fifth via holes form the jumper between the two adjacent windings of the second secondary coil.

In some embodiments, the array substrate comprises a glass substrate, a buffer layer, a gate insulating layer, a gate layer, an interlayer insulating layer, a source-drain layer, and a passivation layer, which are sequentially stacked, the conductive layers of the array substrate comprises the gate layer and the source-drain layer, the main coil of the near field communication antenna in the array substrate is located in the gate layer, and/or the secondary coil of the near field communication antenna is located in the source-drain layer.

According to another aspect of the present disclosure, there is provided a display panel, comprising: a backlight module, and the array substrate mentioned above;

wherein the backlight module is disposed on a light incident side of the array substrate.

In some embodiments, the display panel further comprises a filter module, wherein the filter module is disposed on a light exit side of the array substrate.

According to another aspect of the present disclosure, there is provided a display device comprising: the array substrate mentioned above; or the display panel mentioned above.

According to another aspect of the present disclosure, there is provided a wearable device, comprising: the array substrate mentioned above; or the display panel mentioned above; or the display device mentioned above.

BRIEF DESCRIPTION OF THE DRAWINGS

The above and/or additional aspects and advantages of the present disclosure will become apparent and easy to understand from the following description of the embodiments in conjunction with the accompanying drawings, in which.

DETAILED DESCRIPTION OF THE EMBODIMENTS

Figure 1:
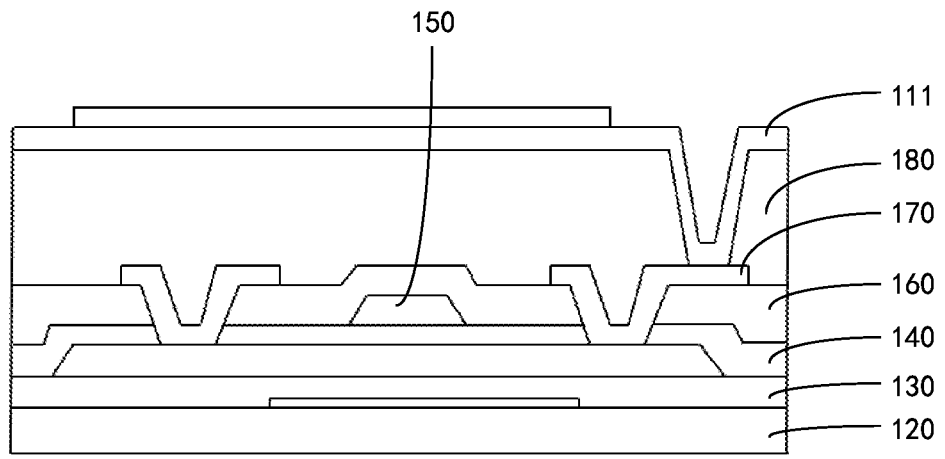
FIG. 1 is a schematic structural view of an array substrate provided by some embodiments of the present disclosure.

The present disclosure is described in detail below. Examples of embodiments of the present disclosure are shown in the drawings, in which the same or similar reference numerals indicate the same or similar components or components having the same or similar functions throughout. In addition, if the detailed description of the known technology is unnecessary for the illustrated features of the present disclosure, it will be omitted. The embodiments described below with reference to the drawings are exemplary, and are only used to explain the present disclosure, and cannot be construed as limiting the present disclosure.

Those skilled in the art can understand that, unless otherwise defined, all terms (including technical and scientific terms) used herein have the same meaning as those generally understood by those of ordinary skill in the art to which the present disclosure belongs. It should also be understood that terms such as those defined in a general dictionary should be understood to have a meaning consistent with the meaning in the context of the prior art, and unless specifically defined as here, it will not be interpreted with idealized or overly formal meanings.

Those skilled in the art can understand that, unless specifically stated, the singular forms "a", "an", "said" and "the" used herein may also include the plural forms. It should be further understood that the word "comprise/ comprising" used in the specification of the present disclosure refers to the presence of the described features and/or components, but does not exclude the presence or addition of one or more other features, components and/or groups thereof. It should be understood that when an element is referred to as being "connected" or "coupled" to another element, it can be directly connected or coupled to the other element, or intervening elements may also be present. In addition, "connected" or "coupled" as used herein may include wirelessly connected or wirelessly coupled. The expression "and/or" as used herein includes all or any unit and all combinations of one or more associated listed items.

First, several terms involved in this disclosure are introduced and explained:

Near field communication which is referred to as NFC.

The inventor of the present disclosure conducted research and found that there are differences in the usage habits between smart wearable devices and mobile phones. Smart wearable products are worn on the body, for example, worn on the wrist, and the user will not choose to use the communication function after taking the products off. Since the NFC antenna is designed inside smart wearable products and is away from display screen, the NFC communication distance is long, the signal quality cannot be guaranteed, and the communication failure rate is high. Therefore, the NFC antenna of the smart wearable device is more suitable for designing on the display screen. However, this design solution is more difficult to be implemented in small-sized wearable products.

According to the formula 'Ψ' (flux)=N (number of turns)×B (magnetic induction intensity)×S (area), because the size of the wearable product is small and the area surrounded by a winding is small, it is necessary to compensate for lacking area by increasing the number of turns. However, there is a limited space for wirings in the screen. As the number of turns of coil increases, the wiring width needs to be reduced. According to the resistance formula R=μL/S, R will increase. The parameter index of the resistance R of the NFC coil needs to satisfy the formula: R<2Ω. Since the size for wiring is 4 mm, the coil is designed to have 4 turns, the coil wiring width of 0.6 mm and the film thickness of 0.58 μm, the calculated internal resistance of the coil is about 45Ω, which cannot meet the requirements of being within 2Ω.

Therefore, the screen-integrated NFC antenna of small-sized wearable product is limited by the screen size, the coil is difficult to route, the internal resistance generally cannot meet the requirements, and the matching is difficult.

In summary, the design difficulties or problems of screen-integrated NFC antenna for small-sized wearable product include:

a) since the antenna is designed inside the screen, the antenna wiring film layer needs to be strictly controlled;

b) due to the small screen size of the wearable products, the space for the NFC antenna to be routed in each film layer is restricted. The line width of the wiring needs to be controlled and constrained. The line width of the wiring is too thin, which will cause the antenna resistance to increase, and the thickness of the wiring film layer is relatively thin, both of them together may cause a large antenna resistance, which in turn causes NFC to be difficult to match during communication.

An array substrate, a display panel, a display device and a wearable device provided by the present disclosure are intended to solve the above technical problems of the prior art.

The technical solutions of the present disclosure and how the technical solutions of the present disclosure solve the above technical problems will be described in detail below with specific embodiments.

Figure 2:
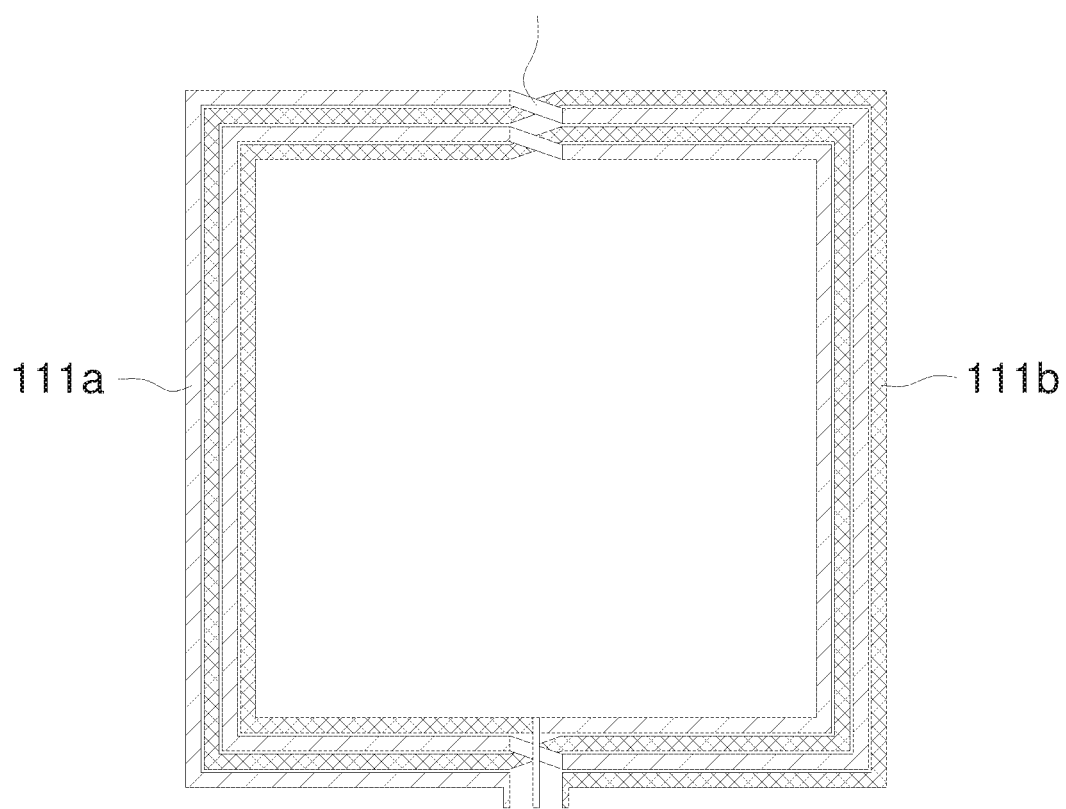
FIG. 2 is a schematic structural view of a main coil of a near field communication antenna provided by some embodiments of the present disclosure.
Figure 3:
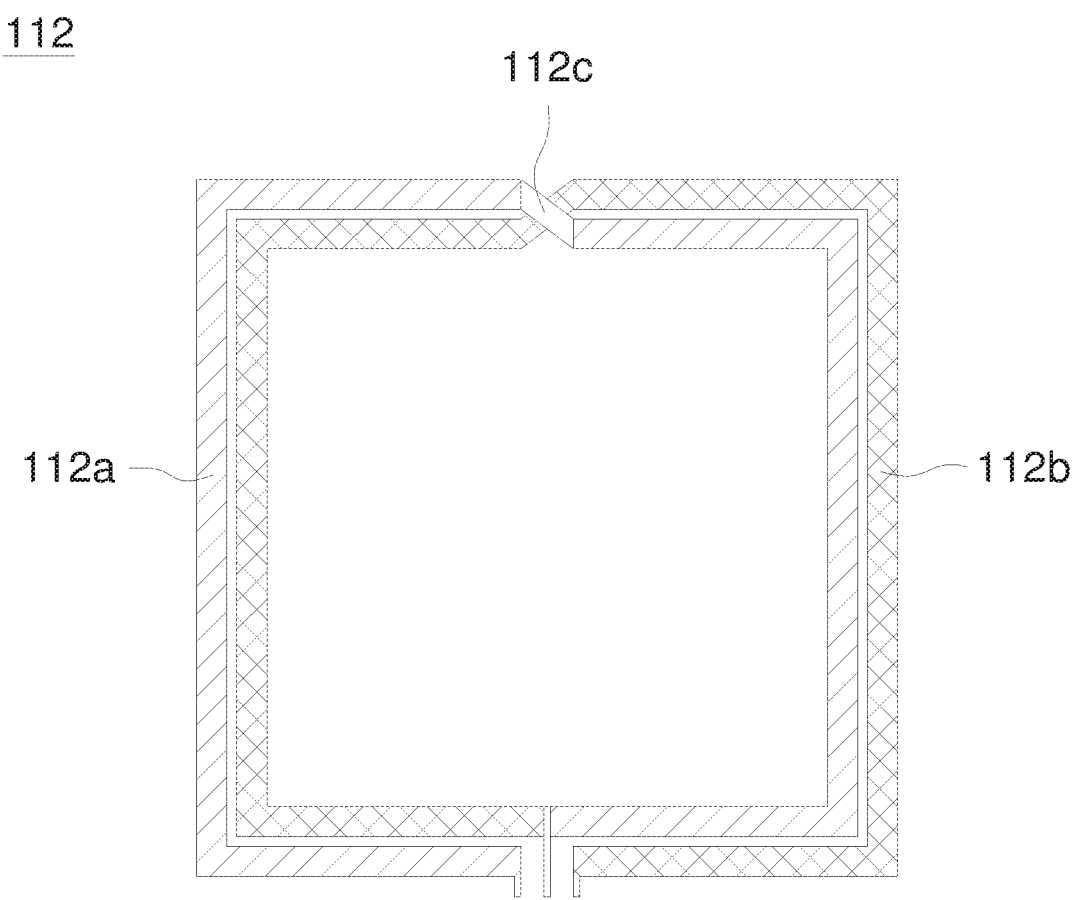
FIG. 3 is a schematic structural view of a secondary coil of a near field communication antenna provided by some embodiments of the present disclosure.

An embodiment of the present disclosure provides an array substrate 100 in which a near field communication antenna is arranged in a conductive layer of the array substrate 100. A schematic structural view of the near field communication antenna is shown in FIGS. 1-3, which includes a main coil 111 and a secondary coil 112.

The main coil 111 and the secondary coil 112 are located in different conductive layers of the array substrate 100, one terminal of the main coil 111 is electrically connected to one terminal of the secondary coil 112 through a first via hole of the array substrate 100, and the other terminal of the main coil 111 is electrically connected to the other terminal of the secondary coil 112 through another first via hole of the array substrate 100.

In this embodiment, by using the conductive layer(s) in the array substrate 100 to arrange the near field communication antenna, the near field communication antenna can be integrated into the array substrate 100. An access end of the near field communication antenna is divided into two, so that the near field communication antenna is divided into the main coil 111 and the secondary coil 112. The main coil 111 and the secondary coil 112 are respectively routed in two conductive layers, and corresponding terminals of the main coil 111 and the secondary coil 112 are electrically connected by using two first via holes, so as to realize the parallel structure of the main coil 111 and the secondary coil 112 of the near field communication antenna.

The near field communication antenna is integrated into the array substrate 100, so that the distance between the near field communication antenna and the display surface of the smart wearable device is shorter, greatly shortening the near field communication distance of the smart wearable device, effectively improving the signal quality, and greatly reducing communication failure rate.

The near field communication antenna is integrated into the array substrate 100, that is, the near field communication antenna is integrated into the display screen. There is no need to separately design the near field communication antenna in other parts of the smart wearable device, which improves the integration of the display screen and can also make the smart wearable device to save space for an independent near field communication antenna, and it is conducive to miniaturization of smart wearable devices.

The near field communication antenna integrated in the array substrate 100 adopts the parallel structure of the main coil 111 and the secondary coil 112, which effectively reduces the internal resistance of the near field communication antenna, so that the near field communication antenna integrated in the array substrate 100 may still have sufficient communication strength to ensure good communication quality.

The inventor of the present disclosure considers that both the main coil 111 and the secondary coil 112 of the near field communication antenna can generate a magnetic field when energized, and the two generated magnetic fields jointly determine the signal quality of the near field communication antenna. To this end, the present disclosure provides the array substrate 100 with one possible implementation manner as follows:

In the array substrate 100 of the embodiment of the present disclosure, the main coil 111 and the secondary coil 112 of the near field communication antenna are arranged coaxially.

In this embodiment, the main coil 111 and the secondary coil 112 of the near field communication antenna are coaxially arranged, that is, under the energized state, the magnetic field generated by the main coil 111 and the magnetic field generated by the secondary coil 112 are superimposed, so that the signal strength of the near field communication antenna can be strengthened, that is, the signal quality of the near field communication antenna can be improved.

The inventor of the present disclosure has considered that the main coil 111 and the secondary coil 112 of the near field communication antenna can be given different functions to reduce the internal resistance of the near field communication antenna, while improving the signal quality of the near field communication antenna. To this end, the present disclosure provides the array substrate 100 with one possible implementation manner as follows:

In the near field communication antenna of the embodiment of the present disclosure, the line width of the main coil 111 is smaller than the line width of the secondary coil 112, and the number of turns of the main coil 111 is larger than that of the secondary coil 112.

In this embodiment, the line width of the main coil 111 is narrower than that of the secondary coil 112, so that the number of turns of the main coil 111 can be increased in a limited wiring space to enhance the magnetic field strength and improve the signal quality of the near field communication antenna. The line width of the secondary coil 112 is wider than that of the main coil 111, and the number of turns of the secondary coil 112 is lower, which can make the internal resistance of the secondary coil 112 smaller. On the premise that the main coil 111 and the sub-coil 112 have a parallel structure, the internal resistance of the entire near field communication antenna can be smaller, which can meet the internal resistance requirements of the near field communication antenna.

In some possible implementation manners, in the near field communication antenna of the embodiment of the present disclosure, the number of turns of the main coil 111 is twice that of the secondary coil 112. For example, the number of turns of the main coil 111 is 4 turns, and the number of turns of the secondary coil 112 is 2 turns.

Optionally, the main coil 111 has a line width of 0.6 mm and a line spacing of 0.2 mm; the secondary coil 112 has a line width of 0.14 mm and a line spacing of 0.2 mm.

The inventor of the present disclosure considered that if the internal resistances of the main coil 111 in the above embodiments can be connected in parallel, the internal resistance of the near field communication antenna can be further reduced. To this end, the present disclosure provides the first possible implementation manner as follow for the array substrate 100:

As shown in FIG. 2, in the near field communication antenna of the embodiment of the present disclosure, the main coil 111 includes: a first main coil 111*a* and a second main coil 111*b*.

The first main coil 111*a* and the second main coil 111*b* are located in the same conductive layer of the array substrate 100, the first main coil 111*a* and the second main coil 111*b* are insulated from each other. One terminal of the first main coil 111*a* is electrically connected to one terminal of the second main coil 111b, and the other terminal of the first main coil 111a is electrically connected to the other terminal of the second main coil 111b.

In this embodiment, the main coil 111 adopts a first main coil 111a and a second main coil 111b, the first main coil 111a and the second main coil 111b are insulated, and corresponding terminals of the first main coil 111a and the second main coil 111b are electrically connected to realize the parallel structure of the first main coil 111a and the second main coil 111b in the main coil 111, which effectively reduces the internal resistance of the main coil 111.

In this embodiment, the first main coil 111a and the second main coil 111b are arranged in the same conductive layer of the array substrate 100, which is beneficial to maximize the use of the same conductive layer, so that the array substrate 100 with a small number of conductive layers can also Integrate near field communication antenna.

Based on the above considerations, the present disclosure provides the second possible implementation manner as follow for the array substrate 100:

As shown in FIG. 2, in the near field communication antenna of the embodiment of the present disclosure, the main coil 111 includes: a first main coil 111a and a second main coil 111b.

The first main coil 111a and the second main coil 111b are located in different conductive layers of the array substrate 100, and one terminal of the first main coil 111a is electrically connected to one terminal of the second main coil 111b through a second via hole of the array substrate 100, the other terminal of the first main coil 111a is electrically connected to the other terminal of the second main coil 111b through another second via hole of the array substrate 100.

In this embodiment, the first main coil 111a and the second main coil 111b are used as the main coil 111. The first main coil 111a and the second main coil 111b are respectively disposed in different conductive layers of the array substrate 100 to achieve mutual insulation. The corresponding terminals of the first main coil 111a and the second main coil 111b are electrically connected by using the second via holes on the array substrate 100, thereby realizing the parallel structure of the first main coil 111a and the second main coil 111b in the main coil 111 and effectively reducing the internal resistance of the main coil 111.

In this embodiment, the first main coil 111a and the second main coil 111b are respectively disposed in different conductive layers of the array substrate 100, which is beneficial to improve the insulation between the first main coil 111a and the second main coil 111b.

Optionally, the second via hole in this embodiment and the first via hole in the foregoing embodiment are independent solid via hole structures.

Optionally, the second via hole in this embodiment shares a solid via hole structure with the first via hole in the foregoing embodiment, and it only needs that the connection portions passing through respective via hole are insulated from each other.

In some possible implementation manners, in the near field communication antenna of the embodiment of the present disclosure, the first main coil 111a and the second main coil 111b are coaxially arranged.

In this embodiment, the first main coil 111a and the second main coil 111b of the near field communication antenna are arranged coaxially, that is, under the energized state, the magnetic field generated by the first main coil 111a and the magnetic field generated by the second main coil 111b are superimposed, so that the magnetic field of the main coil 111 can be strengthen, thereby enhancing the signal strength of the near field communication antenna, that is, improving the signal quality of the near field communication antenna.

In some possible implementations, if the first main coil 111a and the second main coil 111b are located in the same conductive layer of the array substrate 100, windings of the first main coil 111a and windings of the second main coil 111b are arranged alternately. Two adjacent windings of the first main coil 111a are electrically connected by the jumper 111c, and two adjacent windings of the second main coil 111b are also electrically connected by the jumper 111c.

In this embodiment, the windings of the first main coil 111a and the windings of the second main coil 111b in the same conductive layer are arranged alternately, which is helpful to reduce the difference between the magnetic field generated by the first main coil 111a and the magnetic field generated by the second main coil 111b to make the magnetic field generated by the main coil 111 more uniform. It is also advantageous to superimpose the magnetic field generated by the first main coil 111a and the magnetic field generated by the second main coil 111b, so as to enhance the signal strength of the near field communication antenna, that is, the improve the signal quality of the near field communication antenna.

In some possible implementation manners, the array substrate 100 has a plurality of fourth via holes, the fourth via holes form the jumper 111c between two adjacent windings of the first main coil 111a, or the fourth via holes forms the jumper 111c between two adjacent windings of the second main coils 111b.

In this embodiment, the fourth via hole can be used to realize the electrical connection between the two adjacent windings of the first main coil 111a, and the fourth via hole can also be used to realize the two adjacent windings of the second main coil 111b. The electrical connections can be adapted to the structure of the array substrate 100, the normal electrical connection of the two adjacent windings in the first main coil 111a or the second main coil 111b is realized, on the premise of insulation between the first main coil 111a and the second main coil 111b adjacent to each other.

The inventor of the present disclosure considered that if the internal resistances of the secondary coil 112 in the above embodiment can be connected in parallel, the internal resistance of the near field communication antenna can be further reduced. To this end, the present disclosure provides the first possible implementation manner as follow for the array substrate 100:

As shown in FIG. 3, in the near field communication antenna of the embodiment of the present disclosure, the secondary coil 112 includes: a first secondary coil 112a and a second secondary coil 112b.

The first secondary coil 112a and the second secondary coil 112b are located in the same conductive layer of the array substrate 100, the first secondary coil 112a and the second secondary coil 112b are insulated from each other. One terminal of the first secondary coil 112a is electrically connected to one terminal of the second secondary coil 112b, and the other terminal of the first secondary coil 112a is electrically connected to the other terminal of the second secondary coil 112b.

In this embodiment, the secondary coil 112 adopts a first secondary coil 112a and a second secondary coil 112b, the first secondary coil 112a and the second secondary coil 112b are insulated, and corresponding terminals of the first secondary coil 112a and the second secondary coil 112b are electrically connected to realize the parallel structure of the first secondary coil 112a and the second secondary coil 112b in the secondary coil 112, which effectively reduces the internal resistance of the secondary coil 112.

In this embodiment, the first secondary coil 112a and the second secondary coil 112b are arranged in the same conductive layer of the array substrate 100, which is beneficial to maximize the use of the same conductive layer, so that the array substrate 100 with a small number of conductive layers can also integrate near field communication antenna.

Based on the above considerations, the present disclosure provides the second possible implementation manner as follow for the array substrate 100:

As shown in FIG. 3, in the near field communication antenna of the embodiment of the present disclosure, the secondary coil 112 includes: a first secondary coil 112a and a second secondary coil 112b.

The first secondary coil 112a and the second secondary coil 112b are located in different conductive layers of the array substrate 100, and one terminal of the first secondary coil 112a is electrically connected to one terminal of the second secondary coil 112b through a third via hole of the array substrate 100. The other terminal of the first secondary coil 112a is electrically connected to the other terminal of the second secondary coil 112b through another third via hole of the array substrate 100.

In this embodiment, the secondary coil 112 adopts a first secondary coil 112a and a second secondary coil 112b. The first secondary coil 112a and the second secondary coil 112b are respectively disposed in different conductive layers of the array substrate 100 to achieve mutual insulation. The corresponding terminals of first secondary coil 112a and the second secondary coil 112b are electrically connected by using the third via holes on the array substrate 100 to realize the parallel structure of the first secondary coil 112a and the second secondary coil 112b in the secondary coil 112, thereby effectively reducing the internal resistance of the secondary coil 112.

In this embodiment, the first secondary coil 112a and the second secondary coil 112b are respectively disposed in different conductive layers of the array substrate 100, which is beneficial to improve the insulation between the first secondary coil 112a and the second secondary coil 112b.

Optionally, the third via hole in this embodiment and the first via hole and the second via hole in the foregoing embodiments are all independent solid via hole structures.

Optionally, the third via hole in this embodiment shares a solid via hole structure with one of the first via hole and the second via hole in the foregoing embodiments, and it only needs that the connection portions passing through respective via hole are insulated from each other.

Optionally, the third via hole in this embodiment and the first via hole and the second via hole in the foregoing embodiments share a solid via hole structure, and it only needs that the connection portions passing through respective via hole are insulated from each other.

In some possible implementation manners, in the near field communication antenna of the embodiment of the present disclosure, the first secondary coil 112a and the second secondary coil 112b are coaxially arranged.

In this embodiment, the first secondary coil 112a and the second secondary coil 112b of the near field communication antenna are arranged coaxially, that is, under the energized state, the magnetic field generated by the first secondary coil 112a and the magnetic field generated by the second secondary coil 112b are superimposed, so that the magnetic field of the secondary coil 112 can be strengthen, thereby enhancing the signal strength of the near field communication antenna, that is, improving the signal quality of the near field communication antenna.

In some possible embodiments, if the first secondary coil 112a and the second secondary coil 112b are located in the same conductive layer of the array substrate 100, windings of the first secondary coil 112a and windings of the second secondary coil 112b are arranged alternately. Two adjacent windings of the first secondary coil 112a are electrically connected by the jumper 112c, and two adjacent windings of the second secondary coil 112b are also electrically connected by the jumper 112c.

In this embodiment, the windings of the first secondary coil 112a and the windings of the second secondary coil 112b in the same conductive layer are arranged alternately, which is helpful to reduce the difference between the magnetic field generated by the first secondary coil 112a and the magnetic fields generated by the second secondary coil 112b to make the magnetic field generated by the secondary coil 112 more uniform. It is also beneficial to superimpose the magnetic field generated by the first secondary coil 112a and the magnetic field generated by the second secondary coil 112b, so as to enhance the signal strength of the near field communication antenna, that is, improve the signal quality of the near field communication antenna.

In some possible implementation manners, the array substrate 100 of the embodiment of the present disclosure has a plurality of fifth via holes. The fifth via holes form the jumper 111c between two adjacent windings of the first secondary coil 112a, alternatively, the five via holes form the jumper 111c between two adjacent turns of the second secondary coil 112b.

In this embodiment, the fifth via hole can be used to realize the electrical connection between the two adjacent windings of the first secondary coil 112a, and the fifth via hole can also be used to realize the two adjacent windings of the second secondary coil 112b. The electrical connections can be adapted to the structure of the array substrate 100, the normal electrical connection of the two adjacent windings in the first secondary coil 112a or the second secondary coil 112b is realized, on the premise of insulation between the first secondary coil 112a and the second secondary coil 112b adjacent to each other.

In some possible implementation manners, the array substrate 100 of the embodiment of the present disclosure includes a glass substrate 120, a buffer layer 130, a gate insulating layer 140, a gate layer 150, an interlayer insulating layer 160, a source-drain layer 170 and a passivation layer 180 that are sequentially stacked.

The conductive layers of the array substrate 100 includes the gate layer 150 and the source-drain layer 170.

In the array substrate 100, the main coil 111 of the near field communication antenna is located in the gate layer 150, and/or the secondary coil 112 of the near field communication antenna is located in the source-drain layer 170.

Figure 4:
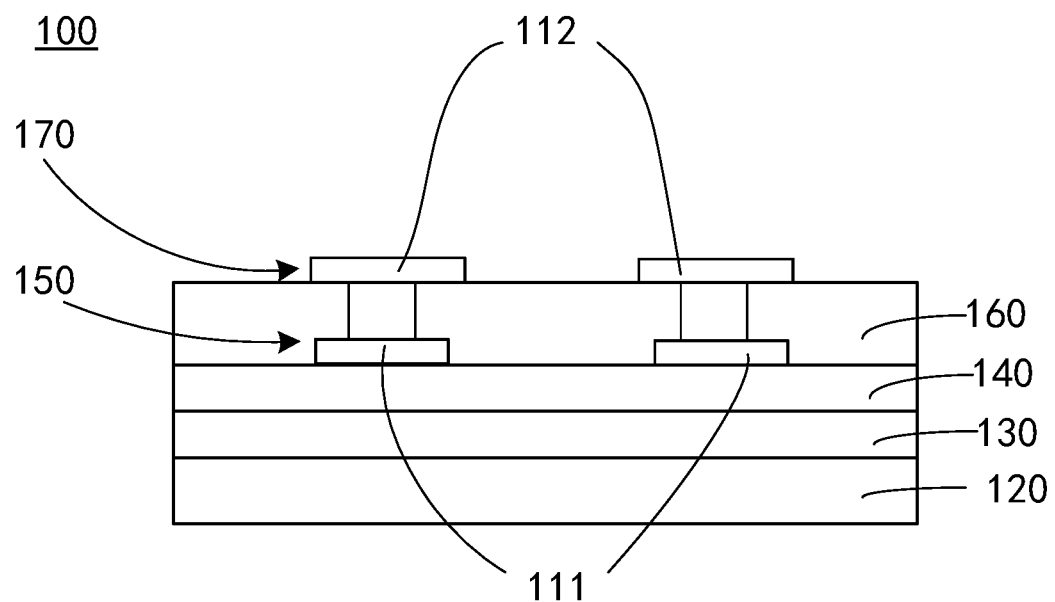
FIG. 4 is a schematic section of an array substrate provided by some embodiments of the present disclosure.

In this embodiment, the gate layer 150 is selected for the main coil 111, and the source-drain layer 170 is selected for the secondary coil 112, as shown in FIG. 4.

Optionally, in the array substrate 100, the main coil 111 of the near field communication antenna is located in the source-drain layer 170, and/or the secondary coil 112 of the near field communication antenna is located in the gate layer 150.

Figure 5:
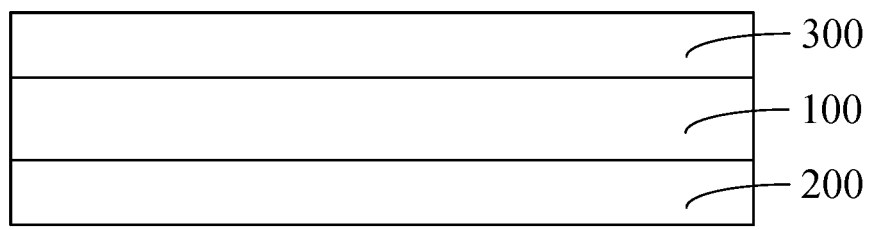
FIG. 5 is a schematic structural view of a display panel provided by some embodiments of the present disclosure.

Based on the same inventive concept, as shown in FIG. 5, an embodiment of the present disclosure provides a display panel 1000, including: a backlight module 200, an optical filter module 300, and any one of the array substrates 100 provided by the foregoing embodiments.

The backlight module 200 is disposed on the light incident side of the array substrate 100.

The filter module 300 is disposed on the light exit side of the array substrate 100.

Since the display panel provided in this embodiment employs any of the array substrates 100 integrated with the near field communication antenna provided in the foregoing embodiments, the display panel has the same principles and beneficial effects as the array substrate 100 provided in the foregoing embodiments. For details, please refer to the foregoing embodiments, which will not be repeated here.

Based on the same inventive concept, an embodiment of the present disclosure provides a display device, including: any one of the array substrates 100 provided by the foregoing embodiments or any display panel as provided in the above embodiments.

Since the display device provided in this embodiment adopts any of the array substrates 100 integrated with near field communication antennas provided in the foregoing embodiments, therefore the display device has the same principles and beneficial effects as the array substrate 100 provided in the foregoing embodiments. For details, please refer to the foregoing embodiments, which will not be repeated here.

Based on the same inventive concept, embodiments of the present disclosure provide a wearable device, including: any one of the array substrates 100 provided by the foregoing embodiments, or any display panel as provided in the above embodiments, or any display device as provided in the above embodiments.

Since the wearable device provided in this embodiment employs any of the array substrates 100 integrated with the near field communication antenna provided in the foregoing embodiments, the wearable device has the same principles and beneficial effects as the array substrate 100 provided in the foregoing embodiments. For details, please refer to the above embodiments, which will not be repeated here.

Applying the embodiments of the present disclosure, at least the following beneficial effects can be achieved:

The near field communication antenna is integrated into the array substrate 100 to make the distance between the near field communication antenna and the display surface of the smart wearable device shorter, thereby greatly shortening the near field communication distance of the smart wearable device, effectively improving the signal quality, and greatly reducing communication failure rate.

The near field communication antenna is integrated into the array substrate 100, that is, the near field communication antenna is integrated into the display screen, and there is no need to separately design the near field communication antenna in other parts of the smart wearable device, which improves the integration of the display screen and can also make the smart wearable device to save space for an independent near field communication antenna, and which is conducive to miniaturization of smart wearable devices.

The near field communication antenna integrated in the array substrate 100 adopts the parallel structure of the main coil 111 and the secondary coil 112, which effectively reduces the internal resistance of the near field communication antenna, so that the near field communication antenna integrated in the array substrate 100 may still have sufficient communication strength to ensure good communication quality.

The main coil 111 and the secondary coil 112 of the near field communication antenna are arranged coaxially, that is, under the energized state, the magnetic field generated by the main coil 111 and the magnetic field generated by the secondary coil 112 are superimposed, so that the signal strength of the near field communication antenna can be strengthened, that is, the signal quality of the near field communication antenna can be improved.

The line width of the main coil 111 is narrower than that of the secondary coil 112, and the number of turns of the main coil 111 can be increased within a limited wiring space to enhance the magnetic field strength and improve the signal quality of the near field communication antenna. The line width of the secondary coil 112 is wider than that of the main coil 111, and the number of turns of the secondary coil 112 is lower, which can make the internal resistance of the secondary coil 112 smaller. On the premise that the main coil 111 and the sub-coil 112 have a parallel structure, the internal resistance of the entire near field communication antenna can be smaller, which can meet the internal resistance requirements of the near field communication antenna.

Those skilled in the art can understand that various operations, methods, steps in the process, measures, and solutions that have been discussed in the present disclosure can be alternated, changed, combined, or deleted. Further, other steps, measures, and solutions in various operations, methods, and processes that have been discussed in the present disclosure may also be alternated, modified, rearranged, decomposed, combined, or deleted. Further, the steps, measures, and solutions in the prior art having various operations, methods, and processes disclosed in the present disclosure may also be alternated, modified, rearranged, decomposed, combined, or deleted.

In the description of the present disclosure, it should be understood that the orientation or positional relationship indicated by the terms "center", "upper", "lower", "front", "rear", "left", "right", "vertical", "horizontal", "top", "bottom", "inner", "outer", etc. is based on the orientation or positional relationship shown in the drawings, it is merely for the convenience of describing the present disclosure and simplifying the description, and does not indicate or imply that the device or element referred to must have a specific orientation, be constructed or operate in a specific orientation, which cannot be construed as a limitation of the present disclosure.

The terms "first" and "second" are used for descriptive purposes only and cannot be understood as indicating or implying relative importance or implicitly indicating the number of technical features indicated. Thus, the features defined as "first" and "second" may explicitly or implicitly include one or more of the features. In the description of the present disclosure, unless otherwise stated, "plurality" means two or more.

In the description of the present disclosure, it should be noted that the terms "installation", "connection", and "couple" should be understood in a broad sense, for example, it can be a fixed connection or a removable connection, or an integrally connection; it can be a directly connection, or indirectly connection through an intermediate medium, or it can be the internal connection between two components. For those of ordinary skill in the art, the specific meaning of the above terms in the present disclosure may be understood in specific situations.

In the description of this specification, specific features, structures, materials, or characteristics may be combined in any suitable manner in any one or more embodiments or examples.

The above is only a part of the embodiments of the present disclosure. It should be noted that, for those of ordinary skill in the art, improvements and modifications can be made without departing from the principles of the present disclosure These improvements and modifications should also be regarded as the scope of protection of this disclosure.

What is claimed is:

1. An array substrate, wherein a near field communication antenna is arranged in conductive layers of the array substrate, and the near field communication antenna comprises: a main coil and a secondary coil, wherein:
　the main coil and the secondary coil are located in different conductive layers of the array substrate, and
　a first terminal of the main coil is electrically connected to a first terminal of the secondary coil through a first via hole of the array substrate, and a second terminal of the main coil is electrically connected to a second terminal of the secondary coil through another first via hole of the array substrate; and
　wherein the array substrate comprises a glass substrate, a buffer layer, a gate insulating layer, a gate layer, an interlayer insulating layer, a source-drain layer, and a passivation layer, which are sequentially stacked, wherein:
　　the conductive layers of the array substrate comprise the gate layer and the source-drain layer;
　　the main coil of the near field communication antenna in the array substrate is located in the gate layer; and/or
　　the secondary coil of the near field communication antenna is located in the source-drain layer.

2. The array substrate according to claim 1, wherein the main coil and the secondary coil of the near field communication antenna are disposed coaxially.

3. The array substrate according to claim 1, wherein a line width of the main coil is smaller than that of the secondary coil, and a number of turns of the main coil is greater than that of the secondary coil.

4. The array substrate according to claim 3, wherein:
　the number of turns of the main coil is twice that of the secondary coil; and/or
　the main coil has a line width of 0.6 mm and a line spacing of 0.2 mm, and the secondary coil has a line width of 0.14 mm and a line spacing of 0.2 mm.

5. A display panel, comprising:
　a backlight module; and
　the array substrate according to claim 1;
　wherein the backlight module is disposed on a light incident side of the array substrate.

6. The display panel according to claim 5, further comprising a filter module, wherein the filter module is disposed on a light exit side of the array substrate.

7. A display device comprising:
　the display panel according to claim 5.

8. A wearable device, comprising:
　the display device according to claim 7.

* * * * *